(12) United States Patent
Lee et al.

(10) Patent No.: US 6,657,863 B2
(45) Date of Patent: Dec. 2, 2003

(54) FAN DUCT ASSEMBLY FOR HEAT DISSIPATION

(75) Inventors: Tsung-Lung Lee, Tu-Chen (TW); Shuai Jiang, Shenzhen (CN); Cheng-Tien Lai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/137,778

(22) Filed: May 1, 2002

(65) Prior Publication Data

US 2003/0153259 A1 Aug. 14, 2003

(30) Foreign Application Priority Data

Feb. 8, 2002 (TW) ........................................ 91201719 A

(51) Int. Cl.[7] ................................................ H05K 7/20
(52) U.S. Cl. ........................ 361/697; 361/695; 454/184
(58) Field of Search ........................ 454/184; 361/695, 361/697

(56) References Cited

U.S. PATENT DOCUMENTS

| | | | | |
|---|---|---|---|---|
| 3,016,813 A | * | 1/1962 | Frasier et al. ............... | 454/184 |
| 5,689,403 A | * | 11/1997 | Robertson et al. ........... | 361/695 |
| 5,917,697 A | * | 6/1999 | Wang ........................... | 361/695 |
| 5,917,698 A | * | 6/1999 | Viallet ......................... | 361/695 |
| 6,064,571 A | * | 5/2000 | Noble .......................... | 361/695 |
| 6,163,453 A | * | 12/2000 | Hou et al. .................... | 361/687 |
| 6,343,011 B1 | * | 1/2002 | Yu ............................... | 361/695 |
| 6,459,580 B1 | * | 10/2002 | Della Fiora et al. ......... | 361/697 |
| 6,462,948 B1 | * | 10/2002 | Leija et al. .................. | 361/697 |
| 6,464,578 B1 | * | 10/2002 | Chin et al. ................... | 454/184 |

* cited by examiner

*Primary Examiner*—Harold Joyce
(74) *Attorney, Agent, or Firm*—Wei Te Chung

(57) ABSTRACT

A fan duct assembly (10) includes a fan duct (20) and a fan (30). The fan duct is connected between a heat sink (50) and a computer casing (40). The heat sink is mounted on a heat-generating electronic device (60) accommodated in the computer casing. The fan duct is made of hard plastic material, and can therefore maintain its shape. The fan duct includes first and second flues (22, 24) oriented substantially perpendicular to each other. The fan is secured in the duct at a junction of the first and second flues. Thus, the fan duct assembly provides a passageway for air to travel between the heat sink and an exterior of the computer casing.

9 Claims, 3 Drawing Sheets

FAN DUCT ASSEMBLY FOR HEAT DISSIPATION

BACKGROUND OF THE INVENTION

1. Field of the Invention

The present invention relates to fan duct assemblies, and more particularly to a fan duct assembly for dissipation of heat from a heat-generating electronic device.

2. Description of Related Art

Conventionally, in a computer casing, a heat sink is attached to a heat-generating electronic device to remove heat therefrom. A rotary fan is attached on the heat sink to improve heat dissipation from the heat sink. Thus, heat dissipation from the electronic device is improved. However, a lot of hot air from the fan and the heat sink remains within the computer casing, because there is no direct passageway for the hot air to escape to an exterior of the casing. Uncontrolled flow of the hot air within the casing results in inefficient air exchange between the interior and the exterior of the casing. Modem electronic devices frequently generate copious amounts of heat. Consequently, the conventional heat sink and fan assembly often does not satisfactorily dissipate heat.

Taiwan Patent Application No. 84214047 discloses a fan duct assembly to overcome the above-mentioned problems. The fan duct assembly comprises a hood, an air conduit, a fan, and a fan cover. The hood is provided on a heat sink that is attached on a heat-generating electronic device. The fan is screwed to the fan cover. The combined fan and fan cover is secured to the computer casing. An air outlet is defined in the hood. An end of the air conduit is in communication with the air outlet of the hood. An opposite end of the air conduit is engaged with the fan. The fan duct assembly thereby provides a direct air passageway from the heat sink to the exterior of the computer casing.

However, installation of the hood, the air conduit, the fan and the fan cover is unduly complicated and time-consuming. In addition, the fan is disposed at an end of the air conduit. Airflow speed is reduced at an opposite end of the air conduit. Furthermore, the air conduit is made of pliable material. The air conduit is prone to become unnecessarily bent, resulting in increased airflow resistance within the air conduit. This further reduces airflow speed. The heat removal capability of the fan duct assembly is all too often inadequate.

It is strongly desired to provide a fan duct assembly which overcomes all the above-mentioned problems.

SUMMARY OF THE INVENTION

Accordingly, an object of the present invention is to provide a fan duct assembly which has a simple structure.

A further object of the present invention is to provide a fan duct assembly which maximizes airflow speed therethrough to enhance heat dissipation capability.

In order to achieve the objects set out above, a fan duct assembly of the present invention comprises a fan duct and a fan. The fan duct is connected between a heat sink and a computer casing. The heat sink is mounted on a heat-generating electronic device accommodated in the computer casing. The fan duct is made of hard plastic material, and can therefore maintain its shape. The fan duct comprises first and second flues oriented substantially perpendicular to each other. The fan is secured in the duct at a junction of the first and second flues. Thus, the fan duct assembly provides a passageway for air to travel between the heat sink and an exterior of the computer casing.

Other objects, advantages and novel features of the present invention will become more apparent from the following detailed description when taken in conjunction with the accompanying drawings.

DETAILED DESCRIPTION OF THE INVENTION

Figure 1:
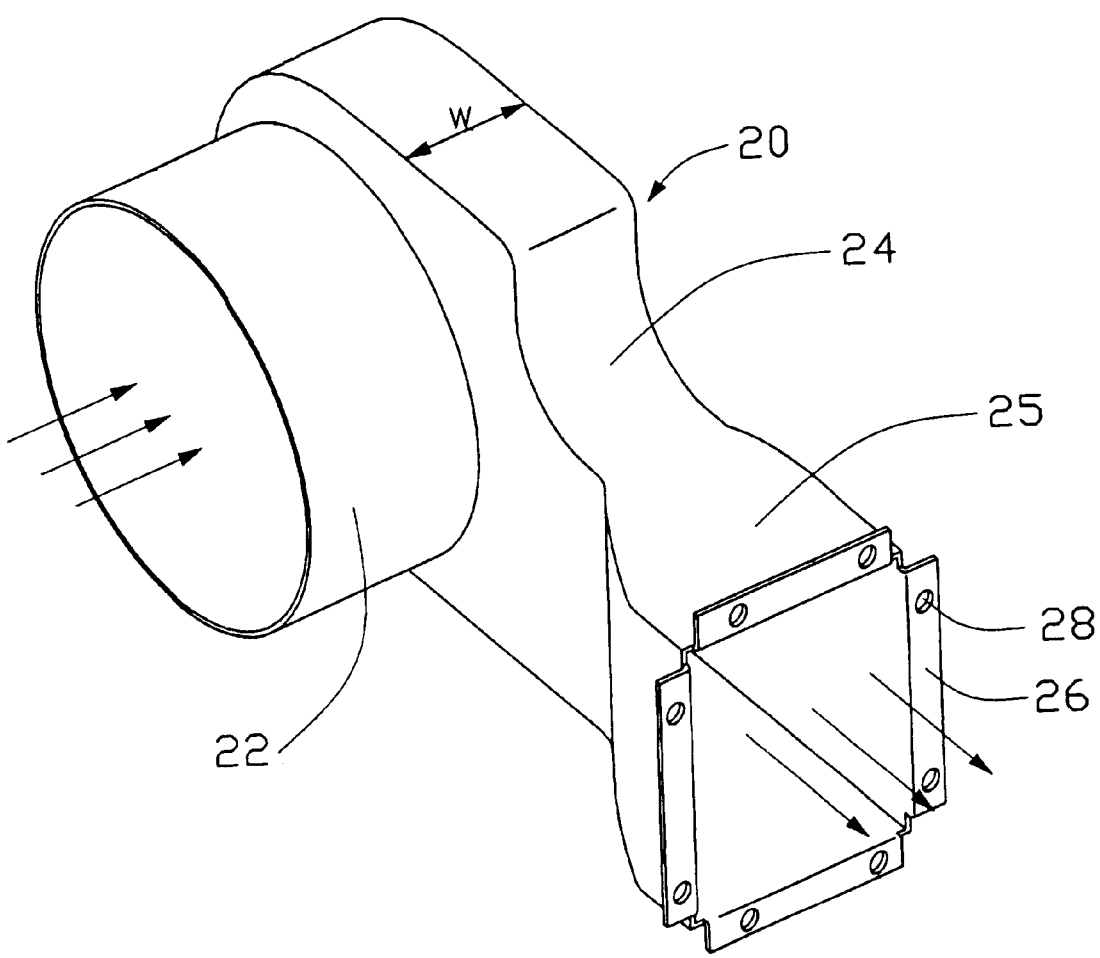
FIG. 1 is a perspective view of a fan duct assembly in accordance with the present invention.

Reference will now be made to the drawing figures to describe the present invention in detail.

Figure 2:
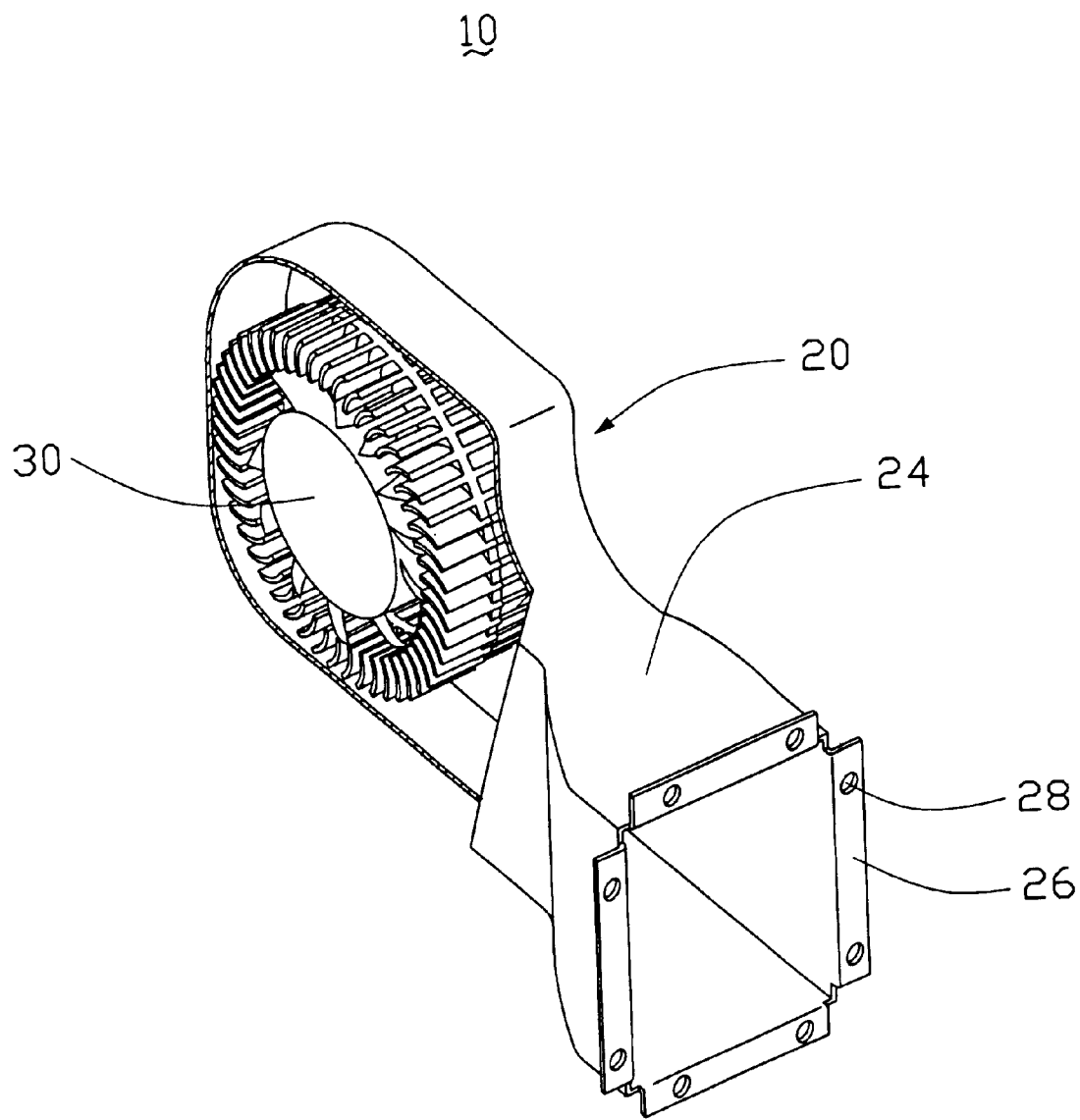
FIG. 2 is similar to FIG. 1, but viewed with part of the fan duct assembly cut away for better illustration.
Figure 3:
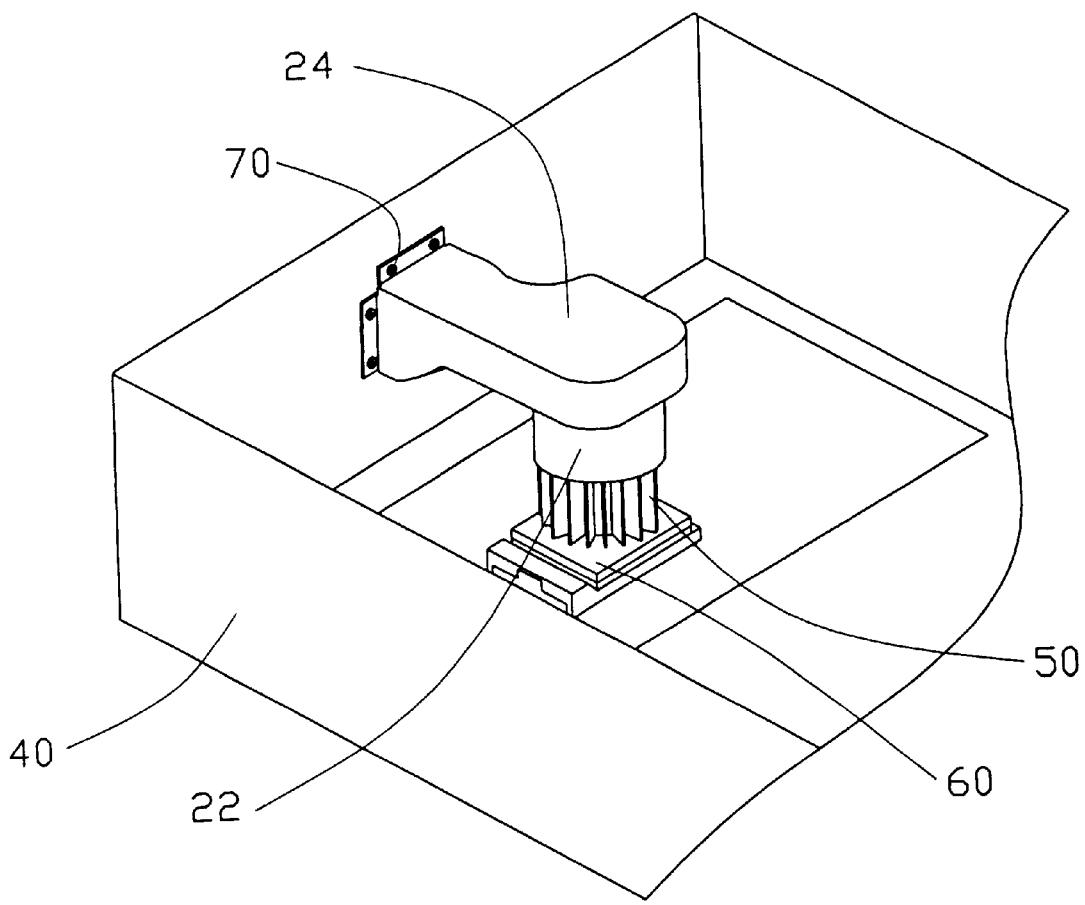
FIG. 3 is a perspective view of the fan duct assembly attached between a computer casing and a heat sink that is mounted on a heat-generating electronic device in the computer casing.

Referring to FIGS. 1–3, a fan duct assembly 10 in accordance with a preferred embodiment of the present invention comprises a fan duct 20 and a fan 30. The fan duct 20 provides a passageway for air to travel from a heat sink 50 to an exterior of a computer casing 40. The heat sink 50 is mounted on a heat-generating electronic device 60 that is located in the computer casing 40. The fan 30 is secured in the fan duct 20, to force exchange of air between an interior and the exterior of the computer casing 40.

The fan duct 20 is preferably made of hard plastic material, which is light yet sturdy and enables the fan duct 20 to maintain its shape. The fan duct 20 comprises first and second flues 22, 24 which are oriented generally perpendicular to each other. The first and second flues 22, 24 are integrally formed by molding. The first flue 22 is generally cylindrical. The second flue 24 has a generally rectangular cross-section. A width W (see FIG. 1) is defined in the second flue 24 at a junction of the first and second flues 22, 24. A distal end 25 of the second flue 24 that is distant from the first flue 22 is flared. Flanges 26 are bent perpendicularly outwardly from free extremities of the distal end 25. A plurality of through holes 28 is defined in the flanges 26, for extension of a plurality of screws 70 (see FIG. 3) therethrough to connect the second flue 24 to the computer casing 40. The fan 30 is a rotary fan. A depth (not labeled) of the fan 30 is similar to the width W of the second flue 24.

In assembly of the fan duct assembly 10, the fan 30 is inserted into the first flue 22 until it reaches an inner face of the second flue 24. The fan 30 is thus disposed at the junction of the first and second flues 22, 24. A base of the fan 30 is attached to the inner face of the second flue 24 by conventional means such as cementing. The fan 30 is thereby secured in the fan duct 20.

Referring particularly to FIG. 3, in use of the fan duct assembly 10, an end of the first flue 22 that is distant from the second flue 24 is mounted on the heat sink 50 by conventional means. The flanges 26 of the second flue 24 are attached to the computer casing 40 with the screws 70, such that an interior of the second flue 24 is in communication with the exterior of the computer casing 40. Thus, an air passageway from the heat sink 50 to the exterior of the computer casing 40 is attained.

FIG. 1 illustrates operation of the fan 30 of the fan duct assembly 10. Air is sucked through the first flue 22 into the fan 30 substantially parallel to an axis of rotation of the fan 30, and air exits the fan 30 into the second flue 24 substantially perpendicular to the axis of rotation of the fan 30. The fan 30 accordingly facilitates airflow from the heat sink 50 to the exterior of the computer casing 40 through the fan duct 20. Therefore, heat conducted from the heat-generating device 60 to the heat sink 50 is speedily dissipated. This facilitates removal of heat from the heat-generating device 60.

A direction of rotation of the fan 30 of the fan duct assembly 10 can be reversed. When this is done, air is sucked through the second flue 24 into the fan 30 substantially perpendicular to the axis of rotation of the fan 30, and air exits the fan 30 into the first flue 22 substantially parallel to the axis of rotation of the fan 30. The fan 30 accordingly facilitates airflow from the exterior of the computer casing 40 to the heat sink 50 through the fan duct 20. This facilitates cooling of the heat-generating device 60.

In the fan duct assembly 10 of present invention, the fan duct 20 is integrally formed by molding. This obviates the need for any assembly of separate parts. The fan 30 is secured in the fan duct 20, and facilitates air convection in the fan duct assembly 10. The fan duct 20 can be shaped to optimize airflow according to the particular configurations of the fan 30, the heat sink 50, the heat-generating device 60 and the computer casing 40. The fan duct 20 is made of sturdy material, which ensures unobstructed airflow, optimized air exchange, and maximized heat dissipation capability.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer system comprising:

a computer casing;

a heat-generating device accommodated in the computer casing;

a heat sink mounted on the heat-generating device;

a duct connected with the heat sink and the computer casing, the duct comprising first and second flues that are oriented at an angle to each other; and a fan secured in the duct and in communication with both the first and second flues;

air among the heat sink being sucked through the first flue into the fan, and exiting the fan through the second flue to an exterior of the computer casing.

2. The computer system as claimed in claim 1, wherein the duct is made of hard plastic material.

3. The computer system as claimed in claim 1, wherein the first and second flues are integrally formed.

4. The computer system as claimed in claim 3, wherein the first flue is mounted on the heat sink.

5. The computer system as claimed in claim 3, wherein an end of the second flue distant from the first flue is flared, and the flared end is engaged with the computer casing such that the second flue is in communication with an exterior of the computer casing.

6. The computer system as claimed in claim 3, wherein the first and second flues are formed by molding.

7. The computer system as claimed in claim 1, wherein the first and second flues are oriented at a right angel to each other.

8. A computer system comprising:

a computer casing;

a heat generating device located in the computer casing;

a heat sink mounted on the heat-generating device;

a duct communicating between said computer casing and said heat sink, and defining two openings in two different directions; and a fan disposed in the duct; wherein the fan is aligned with both the heat sink and one of the two openings along one of said two direction, and also is aligned with the other of the two openings along the other of said two directions.

9. The assembly as claimed in claim 8, wherein said fan is not close to either the computer casing or the heat sink.

\* \* \* \* \*